(12) United States Patent
Kim

(10) Patent No.: US 12,625,513 B2
(45) Date of Patent: May 12, 2026

(54) DUTY CORRECTION CIRCUIT, A CLOCK GENERATION CIRCUIT AND A SEMICONDUCTOR APPARATUS USING THE DUTY CORRECTION CIRCUIT

(71) Applicant: SK hynix Inc., Icheon-si (KR)

(72) Inventor: Young Ouk Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 104 days.

(21) Appl. No.: 18/423,599

(22) Filed: Jan. 26, 2024

(65) Prior Publication Data

US 2025/0093902 A1 Mar. 20, 2025

(30) Foreign Application Priority Data

Sep. 20, 2023 (KR) ........................ 10-2023-0125507

(51) Int. Cl.
*G06F 1/04* (2006.01)
*G11C 7/22* (2006.01)
*H03K 5/156* (2006.01)

(52) U.S. Cl.
CPC ................ *G06F 1/04* (2013.01); *G11C 7/222* (2013.01); *H03K 5/1565* (2013.01); *G11C 2207/2254* (2013.01)

(58) Field of Classification Search
CPC ......... G06F 1/04; H03K 5/1565; G11C 7/222; G11C 2207/2254
See application file for complete search history.

(56) References Cited

U.S. PATENT DOCUMENTS

| | | | |
|---|---|---|---|
| 9,571,106 B2 | 2/2017 | Seo et al. | |
| 9,660,631 B2 | 5/2017 | Seo et al. | |
| 10,284,186 B2 * | 5/2019 | Ma ........................ | H03K 19/003 |
| 2007/0182472 A1 * | 8/2007 | Cho ....................... | H03L 7/0814 |
| | | | 327/158 |
| 2017/0111036 A1 | 4/2017 | Seo et al. | |
| 2021/0200257 A1 * | 7/2021 | Huang ................. | H03K 3/0315 |
| 2023/0336164 A1 * | 10/2023 | Park ....................... | H03K 3/017 |

FOREIGN PATENT DOCUMENTS

KR 102222622 B1 3/2021

* cited by examiner

*Primary Examiner* — Jaweed A Abbaszadeh
(74) *Attorney, Agent, or Firm* — WILLIAM PARK AND ASSOCIATES LTD.

(57) ABSTRACT

A duty correction circuit includes a first delay circuit, a second delay circuit, a dividing circuit, a duty detection circuit, and a delay control signal generation circuit. The first delay circuit is configured to delay a clock signal to generate a first delayed clock signal. The second delay circuit is configured to delay the clock signal based on a delay control signal to generate a second delayed clock signal. The dividing circuit is configured to divide the first and second delayed clock signals to generate a first to fourth phase clock signals. The duty detection circuit is configured to detect phases of the first to fourth phase clock signals to generate a duty detection signal. The delay control signal generation circuit generates the delay control signal based on the duty detection signal.

16 Claims, 9 Drawing Sheets

100

122

410

DUTY CORRECTION CIRCUIT, A CLOCK GENERATION CIRCUIT AND A SEMICONDUCTOR APPARATUS USING THE DUTY CORRECTION CIRCUIT

CROSS-REFERENCES TO RELATED APPLICATION

The present application claims priority under 35 U.S.C. § 119(a) to Korean application number 10-2023-0125507 filed on Sep. 20, 2023, in the Korean Intellectual Property Office, which is incorporated herein by reference in its entirety as set forth in full.

BACKGROUND

1. Technical Field

Various embodiments generally relate to integrated circuit technology, and, more particularly, to a duty correction circuit, a clock generation circuit, and a semiconductor apparatus using the duty correction circuit.

2. Related Art

An electronic device includes a lot of electronic elements and a computer system as the electronic device includes lots of semiconductor apparatuses each configured by semiconductor devices. A semiconductor apparatus constituting a computer system can communicate with each other by transmitting and receiving system clock signal, such as an external clock signal, and data. The semiconductor apparatus may operate in synchronization with a clock signal. The semiconductor apparatus may generate an internal clock signal from the system clock signal to match operation timing with an external device or to secure an operation margin, and may be equipped with a clock generation circuit for generating the internal clock signal.

The clock generation circuit may generate the internal clock signal by changing a phase of the system clock signal or by dividing a frequency of the system clock signal. Further, the clock generation circuit may generate a plurality of internal clock signals having different phases. The clock generation circuit may have a plurality of clock paths to generate the plurality of internal clock signals. For operational reliability of the semiconductor apparatus, the plurality of internal clock signals should have a constant phase difference. However, because the plurality of internal clock signals are generated through different clock paths, the phase difference between the plurality of internal clock signals may be changed due to skew of the clock paths.

SUMMARY

In an embodiment, a duty correction circuit may include a first delay circuit, a second delay circuit, a dividing circuit, a duty detection circuit, and a delay control signal generation circuit. The first delay circuit may be configured to delay a clock signal to generate a first delayed clock signal. The second delay circuit may be configured to variably delay the clock signal based on a delay control signal to generate a second delayed clock signal. The dividing circuit may be configured to divide the first delayed clock signal to generate a first phase clock signal and a third phase clock signal, and may be configured to divide the second delayed clock signal to generate a second phase clock signal and a fourth phase clock signal. The duty detection circuit may be configured to gate the first to fourth phase clock signals to generate a plurality of gating clock signals, and may be configured to generate a duty detection signal based on the plurality of gating clock signals. The delay control signal generation circuit may be configured to generate the delay control signal based on the duty detection signal.

In an embodiment, a clock generation circuit may include a phase delay circuit, a first delay circuit, a second delay circuit, a dividing circuit, a clock gating circuit, a duty detector, and a delay control signal generation circuit. The phase delay circuit may be configured to delay a reference clock signal to generate a delay-locked clock signal. The first delay circuit may be configured to delay the delay-locked clock signal to generate a first delayed clock signal. The second delay circuit may be configured to variably delay the delay-locked clock signal to generate a second delayed clock signal based on a delay control signal. The dividing circuit may be configured to divide the first delayed clock signal to generate a first phase clock signal and a third phase clock signal, and may be configured to divide the second delayed clock signal to generate a second phase clock signal and a fourth phase clock signal. The clock gating circuit may be configured to gate the first to fourth phase clock signals to generate a first gating clock signal, a second gating clock signal, a third gating clock signal, a fourth gating clock signal, a fifth gating clock signal, a sixth gating clock signal, a seventh gating clock signal, and an eighth gating clock signal. The duty detector may be configured to generate a first output signal and a second output signal based on the first to eighth gating clock signals, and configured to compare the first and second output signals to generate a duty detection signal. The delay control signal generation circuit may be configured to generate the delay control signal based on the duty detection signal.

DETAILED DESCRIPTION

Figure 1:
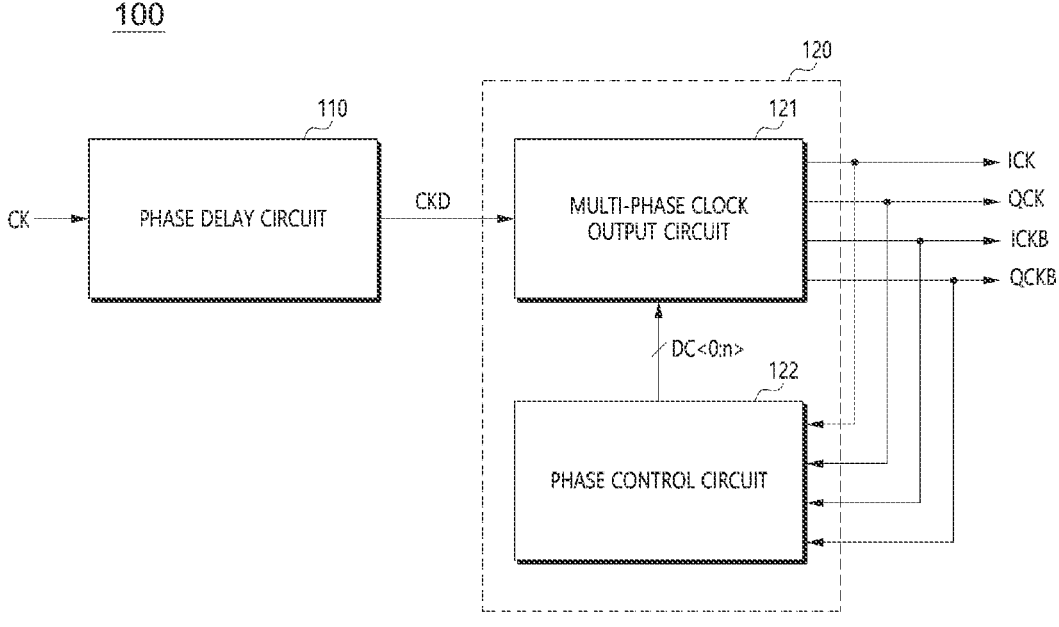
FIG. 1 is a block diagram illustrating a configuration of a clock generation circuit according to an embodiment.

FIG. 1 is a block diagram illustrating a configuration of a clock generation circuit 100 according to an embodiment. Referring to FIG. 1, the clock generation circuit 100 may generate a plurality of phase clock signals having different phases from a reference clock signal CK. The clock generation circuit 100 may perform a delay-locked operation on the reference clock signal CK to generate a delay-locked clock signal CKD, and may generate the plurality of phase clock signals from the delay-locked clock signal CKD. The clock generation circuit 100 may detect a phase skew between the plurality of phase clock signals. The phase skew may mean that a phase difference between one phase clock signal and another phase clock signal is greater than or less than a predetermined phase difference. The clock generation circuit 100 may detect the phase skew of the plurality of phase clock signals by generating a plurality of gating clock signals from the plurality of phase clock signals, and generating a duty detection signal based on the plurality of gating clock signals. The clock generation circuit 100 may perform a duty correction operation by correcting the phase of the plurality of phase clock signals according to a phase skew detection result. The word "predetermined" as used herein with respect to a parameter, such as a predetermined phase difference, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm. It will be understood that although the terms first, second, third etc. may be used herein to describe various elements, these elements should not be limited by these terms. These terms are only used to distinguish one element from another element, but not used to define only the element itself or to mean a particular sequence.

The clock generation circuit 100 may include a phase delay circuit 110 and a duty correction circuit 120. The phase delay circuit 110 may receive the reference clock signal CK, and may delay the reference clock signal CK to generate a delay-locked clock signal CKD. The phase delay circuit 110 may generate the delay-locked clock signal CKD by delaying the reference clock signal CK by a delay amount determined based on operation information of a semiconductor apparatus in which the clock generation circuit 100 is included. For example, the phase delay circuit 110 may include a delay-locked loop circuit. The phase delay circuit 110 may delay the reference clock signal CK to compensate a modelled amount of delay, and may lock the phase of the delay-locked clock signal CKD when a delay operation for the reference clock signal CK is completed. The phase delay circuit 110 may perform a coarse delay-locked operation and a fine delay-locked operation. During the coarse delay-locked operation, the phase delay circuit 110 may delay the reference clock signal CK by a first unit delay amount. During the fine delay-locked operation, the phase delay circuit 110 may delay the reference clock signal CK by a second unit delay amount. The first unit delay amount may be greater than the second unit delay amount. The phase delay circuit 110 may perform the fine delay-locked operation after the coarse delay-locked operation is completed. The phase delay circuit 110 may fix the phase of the delay-locked clock signal CKD upon completion of the fine delay-locked operation. In an embodiment, the phase delay circuit 110 may include a phase-locked loop circuit. The phase delay circuit 110 may generate the delay-locked clock signal CKD by dividing a frequency of the reference clock signal CK. The phase delay circuit 110 may generate the delay-locked clock signal CKD by dividing the reference clock signal CK by two. In an embodiment, the phase delay circuit 110 might not divide the reference clock signal CK, and may generate the delay-locked clock signal CKD having the same frequency as the reference clock signal CK.

The duty correction circuit 120 may receive the delay-locked clock signal CKD from the phase delay circuit 110. The duty correction circuit 120 may generate a plurality of phase clock signals from the delay-locked clock signal CKD. The plurality of phase clock signals may include a first phase clock signal ICK, a second phase clock signal QCK, a third phase clock signal ICKB, and a fourth phase clock signal QCKB. The first to fourth phase clock signals ICK, QCK, ICKB, QCKB may have a phase difference of 90 degrees sequentially. The first phase clock signal ICK may have a leading phase relative to the second phase clock signal QCK. The second phase clock signal QCK may have a leading phase relative to the third phase clock signal ICKB. The third phase clock signal ICKB may have a leading phase relative to the fourth phase clock signal QCKB. The fourth phase clock signal QCKB may have a leading phase relative to the first phase clock signal ICK. The duty correction circuit 120 may detect a phase skew among the first to fourth phase clock signals ICK, QCK, ICKB, QCKB, and correct the phase skew according to the detection result. The duty correction circuit 120 may generate a plurality of gating clock signals by gating the first to fourth phase clock signals ICK, QCK, ICKB, QCKB, and may correct the phase skew among the first to fourth phase clock signals ICK, QCK, ICKB, QCKB by detecting duty cycles of the plurality of gating clock signals.

The duty correction circuit 120 may include a multi-phase clock output circuit 121 and a phase control circuit 122. The multi-phase clock output circuit 121 may generate the first to fourth phase clock signals ICK, QCK, ICKB, QCKB having a phase difference of 90 degrees sequentially based on the delay-locked clock signal CKD. The multi-phase clock output circuit 121 may delay the delay-locked clock signal CKD to generate a first delayed clock signal and a second delayed clock signal. The multi-phase clock output circuit 121 may delay the delay-locked clock signal CKD by a constant delay time to generate the first delayed clock signal. The multi-phase clock output circuit 121 may receive a delay control signal DC<0:n>, and may variably delay the delay-locked clock signal CKD based on the delay control signal DC<0:n> to generate the second delayed clock signal. Here, n may be an integer greater than or equal to 1. The multi-phase clock output circuit 121 may divide the first delayed clock signal to generate the first phase clock signal ICK and the third phase clock signal ICKB. The multi-phase clock output circuit 121 may divide the second delayed clock signal to generate the second phase clock signal QCK and the fourth phase clock signal QCKB. Because the multi-phase clock output circuit 121 generates the first and third phase clock signals ICK, ICKB in synchronization with the first delayed clock signal, a phase skew might not exist between the first and third phase clock signals ICK, ICKB. Because the multi-phase clock output circuit 121 generates the second and fourth phase clock signals QCK, QCKB in synchronization with the second delayed clock signal, a phase skew might not exist between the second and fourth phase clock signals QCK, QCKB. Therefore, only phase skew between the first and second phase clock signals ICK, QCK or between the third and fourth phase clock signals ICKB, QCKB may exist. The multi-phase clock output circuit 121 may adjust the phase of the second and fourth phase clock signals QCK, QCKB by adjusting the phase of the second delayed clock signal based on the delay control signal DC<0:n>, and may correct the phase skew between the first and second phase clock signals ICK, QCK or between the third and fourth phase clock signals ICKB, QCKB.

The phase control circuit 122 may receive the first to fourth phase clock signals ICK, QCK, ICKB, QCKB to generate the delay control signal DC<0:n>. The phase control circuit 122 may detect a phase of the first to fourth phase clock signals ICK, QCK, ICKB, QCKB, and generate the delay control signal DC<0:n> based on the detected phase. The phase control circuit 122 may gate the first to fourth phase clock signals ICK, QCK, ICKB, QCKB to generate the plurality of gating clock signals. The phase control circuit 122 may generate a duty detection signal based on the plurality of gating clock signals. The phase control circuit 122 may generate the delay control signal DC<0:n> based on the duty detection signal.

Figure 2:
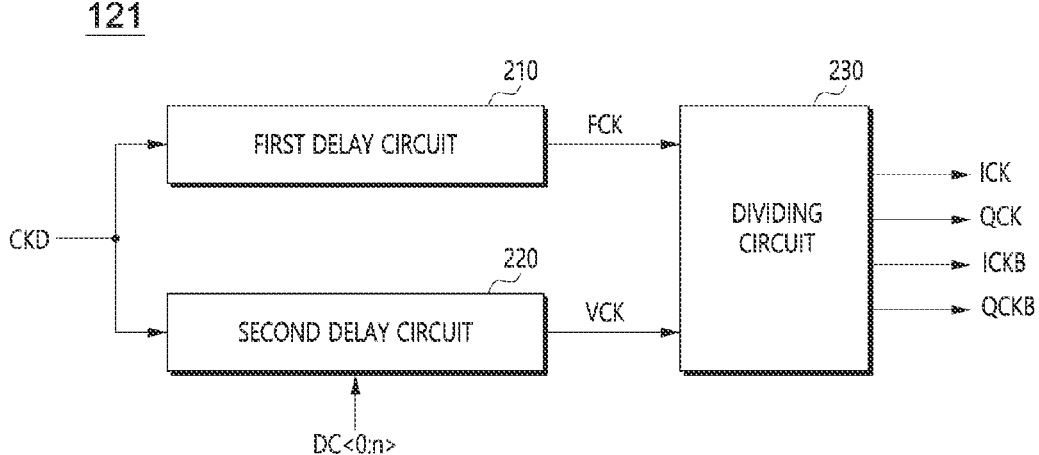
FIG. 2 is a block diagram illustrating a configuration of an embodiment of a multi-phase clock output circuit illustrated in FIG. 1.

FIG. 2 is a block diagram illustrating a configuration of an embodiment of the multi-phase clock output circuit 121 shown in FIG. 1. Referring to FIG. 2, the multi-phase clock output circuit 121 may include a first delay circuit 210, a second delay circuit 220, and a dividing circuit 230. The first delay circuit 210 may receive the delay-locked clock signal CKD, and may delay the delay-locked clock signal CKD to generate a first delayed clock signal FCK. The delay time of the first delay circuit 210 may be constant, and the first delay circuit 210 may delay the delay-locked clock signal CKD by a constant delay time to generate the first delayed clock signal FCK.

The second delay circuit 220 may receive the delay-locked clock signal CKD, and may delay the delay-locked clock signal CKD to generate a second delayed clock signal VCK. The second delay circuit 220 may receive the delay control signal DC<0:n>, and may generate the second delayed clock signal VCK based on the delay control signal DC<0:n>. A delay time of the second delay circuit 220 may be variable based on the delay control signal DC<0:n>. A default delay time of the second delay circuit 220 may be substantially the same as the delay time of the first delay circuit 210. For example, a default value of the delay control signal DC<0:n> may set the delay time of the second delay circuit 220 to be substantially equal to the delay time of the first delay circuit 210. The second delay circuit 220 may generate the second delayed clock signal VCK by variably delaying the delay-locked clock signal CKD based on the delay control signal DC<0:n>.

The dividing circuit 230 may receive the first delayed clock signal FCK and the second delayed clock signal VCK. The dividing circuit 230 may divide the frequencies of the first and second delayed clock signals FCK, VCK to generate the first to fourth phase clock signals ICK, QCK, ICKB, QCKB. The dividing circuit 230 may divide the frequency of the first delayed clock signal FCK to generate the first phase clock signal ICK and the third phase clock signal ICKB. The dividing circuit 230 may divide the frequency of the second delayed clock signal VCK to generate the second phase clock signal QCK and the fourth phase clock signal QCKB. The multi-phase clock output circuit 121 may generate the first and second delayed clock signals FCK, VCK by delaying the delay-locked clock signal CKD through the first delay circuit 210 and the second delay circuit 220, respectively, and then may generate the first to fourth phase clock signals ICK, QCK, ICKB, QCKB by dividing the first and second delayed clock signals FCK, VCK, thus, in an embodiment, reducing the number of delay circuits for generating a plurality of phase clock signals, and reducing the circuit area of the duty correction circuit. In an embodiment, because the dividing circuit 230 might not generate a skew between the first and third phase clock signals ICK, ICKB and between the second and fourth phase clock signals QCK, QCKB, only one delay control signal may be used to correct the phase skew between the first to fourth phase clock signals ICK, QCK, ICKB, QCKB.

Figure 3:
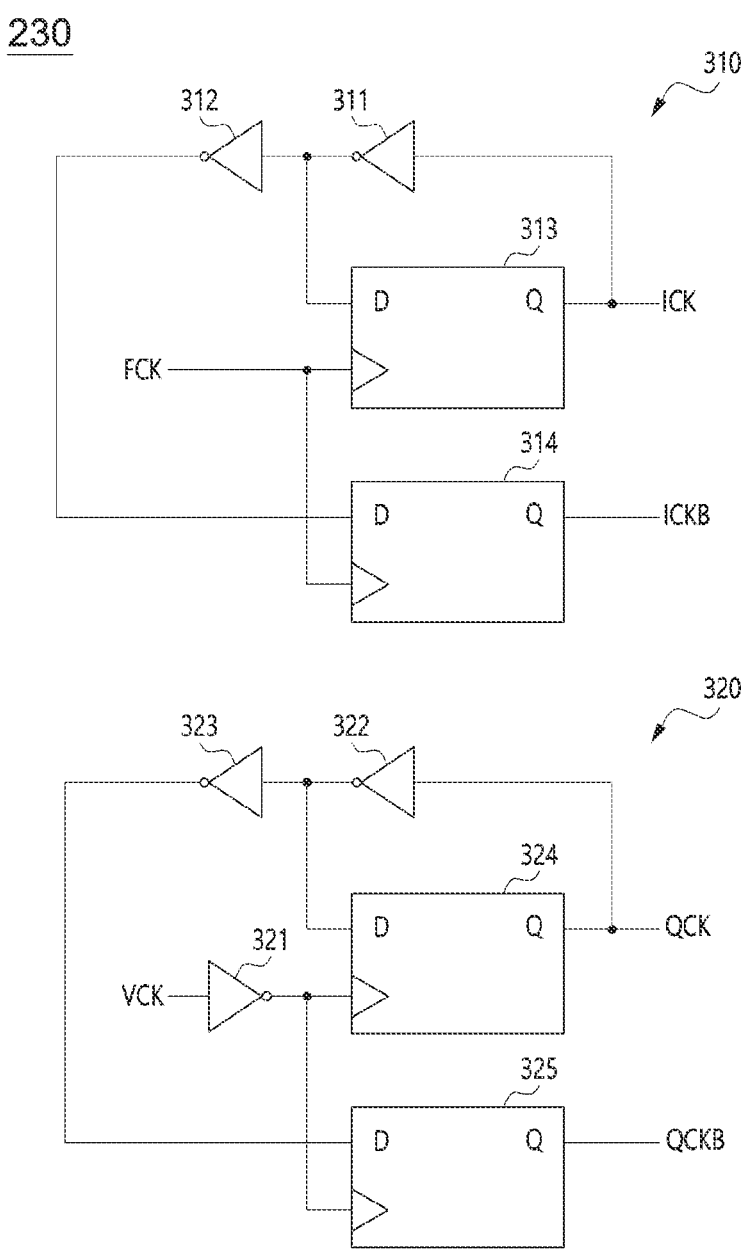
FIG. 3 is a block diagram illustrating a configuration of an embodiment of a dividing circuit illustrated in FIG. 2.

FIG. 3 is a diagram illustrating a configuration of an embodiment of the dividing circuit 230 shown in FIG. 2. Referring to FIG. 3, the dividing circuit 230 may include a first divider 310 and a second divider 320. The first divider 310 may receive the first delayed clock signal FCK, and may divide the first delayed clock signal FCK to generate the first phase clock signal ICK and the third phase clock signal ICKB. The second divider 320 may receive the second delayed clock signal VCK, and may divide the second delayed clock signal VCK to generate the second phase clock signal QCK and the fourth phase clock signal QCKB.

The first divider 310 may include a first inverter 311, a second inverter 312, a first flip-flop 313, and a second flip-flop 314. The first inverter 311 may receive the first phase clock signal ICK, and may invert the first phase clock signal ICK. The second inverter 312 may receive an output signal of the first inverter 311, and may invert the output signal of the first inverter 311. The first flip-flop 313 may output the output signal of the first inverter 311 as the first phase clock signal ICK in synchronization with the first delayed clock signal FCK. An input terminal D of the first flip-flop 313 receives the output signal of the first inverter 311, a clock terminal of the first flip-flop 313 receives the first delayed clock signal FCK, and the first phase clock signal ICK may be output from an output terminal Q of the first flip-flop 313. The second flip-flop 314 may output an output signal of the second inverter 312 as the third phase clock signal ICKB in synchronization with the first delayed clock signal FCK. An input terminal D of the second flip-flop 314 receives the output signal of the second inverter 312, a clock terminal of the second flip-flop 314 receives the first delayed clock signal FCK, and the third phase clock signal ICKB may be output from an output terminal Q of the second flip-flop 314. The first divider 310 may generate the first phase clock signal ICK having a phase synchronized to odd rising edges of the first delayed clock signal FCK. The first phase clock signal ICK may transition from a low logic level to a high logic level in synchronization with odd rising edges of the first delayed clock signal FCK, and may transition from a high logic level to a low logic level in synchronization with even rising edges of the first delayed clock signal FCK. The first divider 310 may generate the third phase clock signal ICKB having a phase synchronous to even rising edges of the first delayed clock signal FCK. The third phase clock signal ICKB may transition from a low logic level to a high logic level in synchronization with even rising edges of the first delayed clock signal FCK, and may transition from a high logic level to a low logic level in synchronization with odd rising edges of the first delayed clock signal FCK.

The second divider 320 may include a third inverter 321, a fourth inverter 322, a fifth inverter 323, a third flip-flop 324, and a fourth flip-flop 325. The third inverter 321 may receive the second delayed clock signal VCK, and may invert the second delayed clock signal VCK. The fourth inverter 322 may receive the second phase clock signal QCK, and may invert the second phase clock signal QCK. The fifth inverter 323 may receive an output signal of the fourth inverter 322, and may invert the output signal of the fourth inverter 322. The third flip-flop 324 may output an output signal of the fourth inverter 322 as the second phase clock signal QCK in synchronization with an output signal of the third inverter 321 (i.e., a complementary signal of the second delayed clock signal VCK). An input terminal D of the third flip-flop 324 receives the output signal of the fourth inverter 322, a clock terminal of the third flip-flop 324 receives the output signal of the third inverter 321, and the second phase clock signal QCK may be output from an output terminal Q of the third flip-flop 324. The fourth flip-flop 325 may output an output signal of the fifth inverter 323 as the fourth phase clock signal QCKB in synchronization with the output signal of the third inverter 321. An input terminal D of the fourth flip-flop 325 receives the output signal of the fifth inverter 323, a clock terminal of the fourth flip-flop 325 receives the output signal of the third inverter 321, and the fourth phase clock signal QCKB may be output from an output terminal Q of the fourth flip-flop 325. The second divider 320 may generate the second phase clock signal QCK having a phase synchronized to odd falling edges of the second delayed clock signal VCK. The second phase clock signal QCK may transition from a low logic level to a high logic level in synchronization with odd falling edges of the second delayed clock signal VCK, and may transition from a high logic level to a low logic level in synchronization with even falling edges of the second delayed clock signal VCK. The second divider 320 may generate the fourth phase clock signal QCKB having a phase synchronous to even falling edges of the second delayed clock signal VCK. The fourth phase clock signal QCKB may transition from a low logic level to a high logic level in synchronization with even falling edges of the second delayed clock signal VCK, and may transition from a high logic level to a low logic level in synchronization with odd falling edges of the second delayed clock signal VCK.

Figure 4:
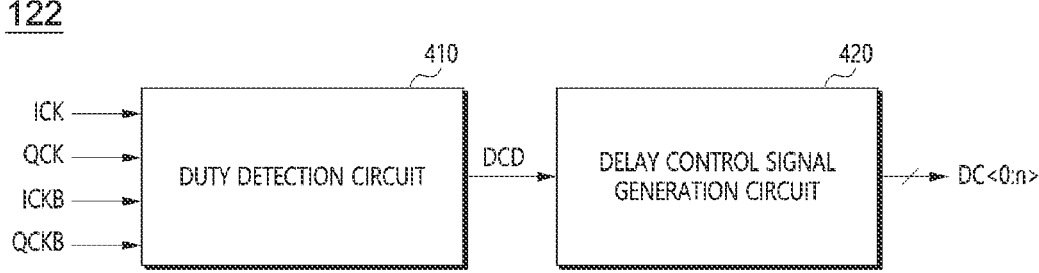
FIG. 4 is a block diagram illustrating a configuration of an embodiment of a phase control circuit illustrated in FIG. 1.

FIG. 4 is a block diagram illustrating a configuration of an embodiment of the phase control circuit 122 shown in FIG. 1. Referring to FIG. 4, the phase control circuit 122 may include a duty detection circuit 410 and a delay control signal generation circuit 420. The duty detection circuit 410 may receive the first to fourth phase clock signals ICK, QCK, ICKB, QCKB, and may generate a duty detection signal DCD based on the first to fourth phase clock signals ICK, QCK, ICKB, QCKB. The duty detection circuit 410 may generate the duty detection signal DCD by detecting a phase difference between the first phase clock signal ICK and the second phase clock signal QCK or a phase difference between the third phase clock signal ICKB and the fourth phase clock signal QCKB. The duty detection circuit 410 may generate a plurality of gating clock signals by gating the first to fourth phase clock signals ICK, QCK, ICKB, QCKB. The duty detection circuit 410 may generate a first output signal and a second output signal based on the plurality of gating clock signals. The first output signal may have a voltage level that varies based on a portion of the plurality of gating clock signals, and the second output signal may have a voltage level that varies based on the remainder of the plurality of gating clock signals. The duty detection circuit 410 may compare the first and second output signals to generate the duty detection signal DCD. The duty detection signal DCD may have a high logic level or a low logic level.

The delay control signal generation circuit 420 may receive the duty detection signal DCD from the duty detection circuit 410. The delay control signal generation circuit 420 may generate the delay control signal DC<0:n> based on the duty detection signal DCD. The delay control signal generation circuit 420 may change a logic value of the delay control signal DC<0:n> based on the duty detection signal DCD. For example, the delay control signal generation circuit 420 may stepwise decrease the logic value of the delay control signal DC<0:n> whenever the duty detection signal DCD having a high logic level is received. The delay control signal generation circuit 420 may stepwise increase the logic value of the delay control signal DC<0:n> whenever the delay control signal generation circuit 420 receives the duty detection signal DCD having a low logic level.

Figure 5:
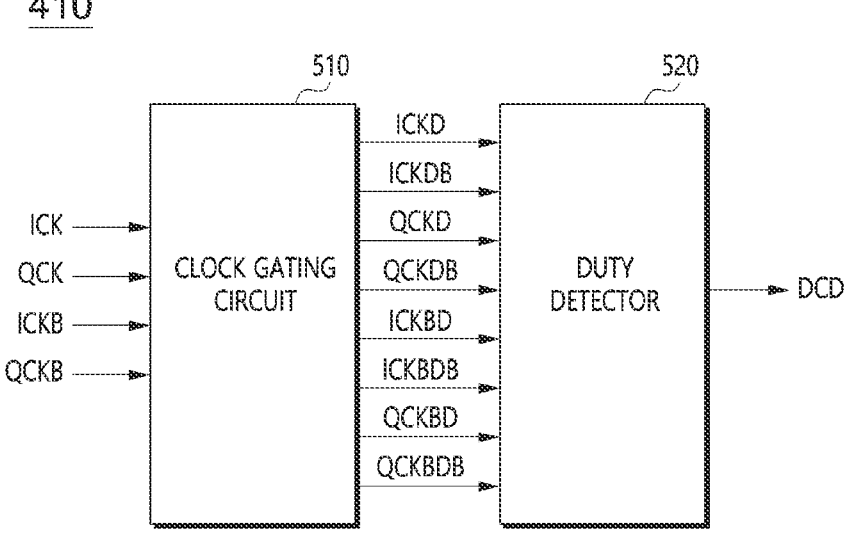
FIG. 5 is a block diagram illustrating a configuration of an embodiment of a duty detection circuit of FIG. 4.

FIG. 5 is a block diagram illustrating a configuration of an embodiment of the duty detection circuit 410 shown in FIG. 4. Referring to FIG. 5, the duty detection circuit 410 may include a clock gating circuit 510 and a duty detector 520. The clock gating circuit 510 may receive the first to fourth phase clock signals ICK, QCK, ICKB, QCKB, and may generate the plurality of gating clock signals. The clock gating circuit 510 may gate the first to fourth phase clock signals ICK, QCK, ICKB, QCKB to generate a first gating clock signal ICKD, a second gating clock signal ICKDB, and a third gating clock signal QCKD, a fourth gating clock signal QCKDB, a fifth gating clock signal ICKBD, a sixth gating clock signal ICKBDB, a seventh gating clock signal QCKBD, and an eighth gating clock signal QCKBDB. The clock gating circuit 510 may generate the first and second gating clock signals ICKD, ICKDB based on the first phase clock signal ICK. The clock gating circuit 510 may delay the first phase clock signal ICK to generate the first and second gating clock signals ICKD, ICKDB, and the second gating clock signal ICKDB may have a phase opposite to the first gating clock signal ICKD. The clock gating circuit 520 may generate the third and fourth gating clock signals QCKD, QCKDB based on the second phase clock signal QCK. The clock gating circuit 520 may delay the second phase clock signal QCK to generate the third and fourth gating clock signals QCKD, QCKDB, and the fourth gating clock signal QCKDB may have an opposite phase to the third gating clock signal QCKD. The clock gating circuit 510 may generate the fifth and sixth gating clock signals ICKBD, ICKBDB based on the third phase clock signal ICKB. The clock gating circuit 510 may delay the third phase clock signal ICKB to generate the fifth and sixth gating clock signals ICKBD, ICKBDB, and the sixth gating clock signal ICKBDB may have a phase opposite to the fifth gating clock signal ICKBD. The clock gating circuit 510 may generate the seventh and eighth gating clock signals QCKBD, QCKBDB based on the fourth phase clock signal QCKB. The clock gating circuit 510 may delay the fourth phase clock signal QCKB to generate the seventh and eighth gating clock signals QCKBD, QCKBDB, and the eighth gating clock signal QCKBDB may have a phase opposite to the seventh gating clock signal QCKBD. A time that the clock gating circuit 510 delays the first to fourth phase clock signals ICK, QCK, ICKB, QCKB to generate the first to eighth gating clock signals ICKD, ICKDB, QCKD, QCKDB, ICKBD, ICKBD, QCKBD, QCKBDB may be less than a time corresponding to a half cycle of the first to fourth phase clock signals ICK, QCK, ICKB, QCKB.

The duty detector 520 may receive the first to eighth gating clock signals ICKD, ICKDB, QCKD, QCKDB, ICKBD, ICKB, QCKBDB from the clock gating circuit 510. The duty detector 520 may generate the first output signal and the second output signal based on the first to eighth gating clock signal ICKD, ICKDB, QCKD, QCKDB, ICKBD, ICKBDB, QCKBD, QCKBDB. The duty detector 520 may generate the first output signal based on a portion of the first to eighth gating clock signal ICKD, ICKDB, QCKD, QCKDB, ICKBD, ICKBDB, QCKBD, QCKBDB, and may generate the second output signal based on the remainder of the first to eighth gating clock signal ICKD, ICKDB, QCKD, QCKDB, ICKBD, ICKBDB, QCKBD, QCKBDB. For example, the duty detector 520 may generate the first output signal based on the second gating clock signal ICKDB, the third gating clock signal QCKD, the sixth gating clock signal ICKBDB, and the seventh gating clock signal QCKBD. The duty detector 520 may generate the second output signal based on the first gating clock signal ICKD, the fourth gating clock signal QCKDB, the fifth gating clock signal ICKBD, and the eighth gating clock signal QCKBDB. The duty detector 520 may generate the duty detection signal DCD by comparing the first and second output signals.

Figure 6:
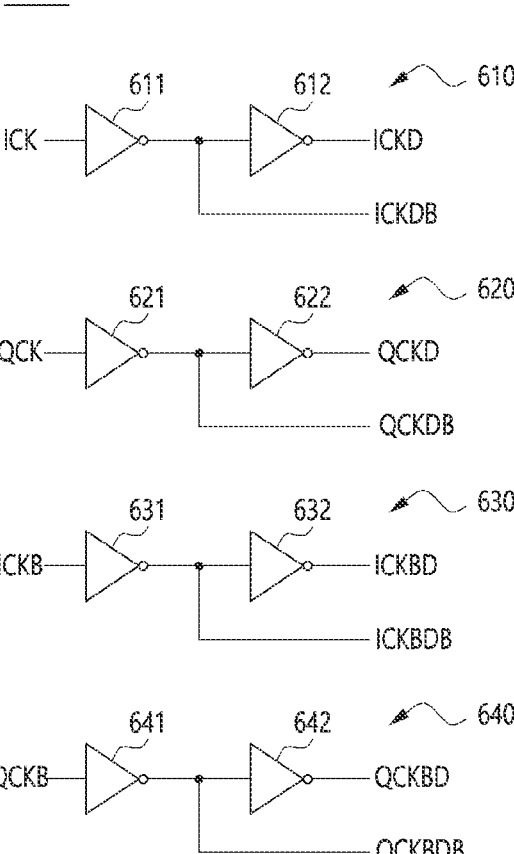
FIG. 6 is a block diagram illustrating a configuration of an embodiment of a clock gating circuit of FIG. 5.

FIG. 6 is a diagram illustrating a configuration of an embodiment of the clock gating circuit 510 shown in FIG. 5. Referring to FIG. 6, the clock gating circuit 510 may include a first gating circuit 610, a second gating circuit 620, a third gating circuit 630, and a fourth gating circuit 640. The first gating circuit 610 may include a first inverter 611 and a second inverter 612. The first inverter 611 may receive the first phase clock signal ICK, invert and delay the first phase clock signal ICK, and output the second gating clock signal ICKDB. The second inverter 612 may receive the second gating clock signal ICKDB, invert the second gating clock signal ICKDB, and generate the first gating clock signal ICKD. The second gating circuit 620 may include a third inverter 621 and a fourth inverter 622. The third inverter 621 may receive the second phase clock signal QCK, and may invert and delay the second phase clock signal QCK to output the fourth gating clock signal QCKDB. The fourth inverter 622 may receive the fourth gating clock signal QCKDB, invert the fourth gating clock signal QCKDB to generate the third gating clock signal QCKD. The third gating circuit 630 may include a fifth inverter 631 and a sixth inverter 632. The fifth inverter 631 may receive the third phase clock signal ICKB, and may invert and delay the third phase clock signal ICKB to output the sixth gating clock signal ICKBDB. The sixth inverter 632 may receive the sixth gating clock signal ICKBDB, invert the sixth gating clock signal ICKBDB, and generate the fifth gating clock signal ICKBD. The fourth gating circuit 640 may include a seventh inverter 641 and an eighth inverter 642. The seventh inverter 641 may receive the fourth phase clock signal QCKB, and may invert and delay the fourth phase clock signal QCKB to output the eighth gating clock signal QCKBDB. The eighth inverter 642 may receive the eighth gating clock signal QCKBDB, invert the eighth gating clock signal QCKBDB, and generate the seventh gating clock signal QCKBD.

Figure 7:
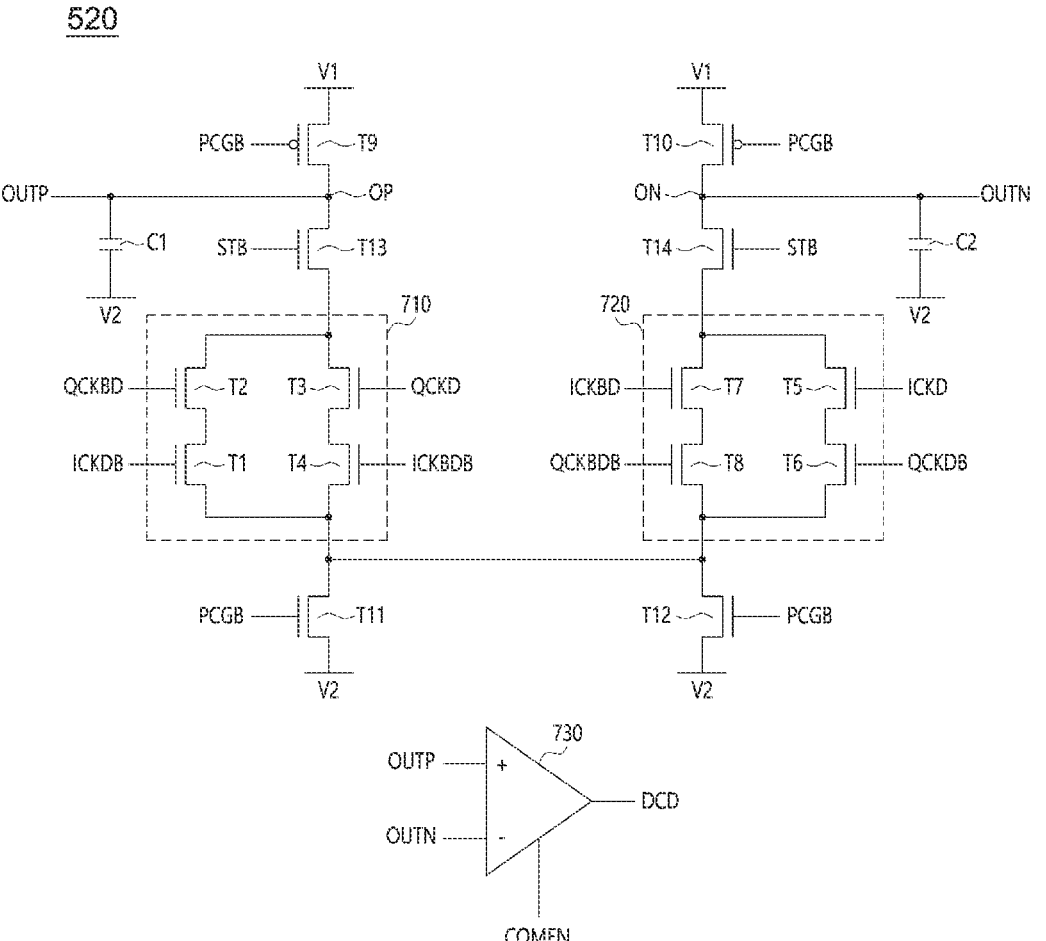
FIG. 7 is a diagram illustrating a configuration of an embodiment of a duty detector of FIG. 5.

FIG. 7 is a diagram illustrating a configuration of an embodiment of the duty detector 520 shown in FIG. 5. Referring to FIG. 7, the duty detector 520 may include a first capacitor C1, a second capacitor C2, a first discharge circuit 710, a second discharge circuit 720, and a comparator 730. One end of the first capacitor C1 may be coupled with a first output node OP, and a first voltage V1 may be applied to the first output node OP. A first output signal OUTP may be output from the first output node OP. The other end of the first capacitor C1 may be coupled with a terminal to which a second voltage V2 is supplied. The second voltage V2 may have a lower voltage level than the first voltage V1. One end of the second capacitor C2 may be coupled with a second output node ON, and the first voltage V1 may be applied to the second output node ON. A second output signal OUTN may be output from the second output node ON. The other end of the second capacitor C2 may be coupled with the terminal to which the second voltage V2 is supplied.

The first discharge circuit 710 may be coupled between the first output node OP and the terminal to which the second voltage V2 is supplied, and may receive the second gating clock signal ICKDB, the third gating clock signal QCKD, the sixth gating clock signal ICKBDB, and the seventh gating clock signal QCKBD. The first discharge circuit 710 may change a voltage level of the first output node OP based on the second gating clock signal ICKDB and the seventh gating clock signal QCKBD or the third gating clock signal QCKD and the sixth gating clock signal ICKBDB. The first discharge circuit 710 may change the voltage level of the first output node OP during a high-level period of the second gating clock signal ICKDB and the seventh gating clock signal QCKBD, and may change the voltage level of the first output node OP during a high-level period of the third gating clock signal QCKD and the sixth gating clock signal ICKBDB. When the second gating clock signal ICKDB and the seventh gating clock signal QCKBD have a high level, or when the third gating clock signal QCKD and the sixth gating clock signal ICKBDB have a high level, the first discharge circuit 710 may decrease the voltage level of the first output node OP by causing a current to flow from the first output node OP to the terminal to which the second voltage V2 is supplied.

The second discharge circuit 720 may be coupled between the second output node ON and the terminal to which the second voltage V2 is supplied, and may receive the first gating clock signal ICKD, the fourth gating clock signal QCKDB, the fifth gating clock signal ICKBD, and the eighth gating clock signal QCKBDB. The second discharge circuit 720 may change a voltage level of the second output node ON based on the first gating clock signal ICKD and the fourth gating clock signal QCKDB or the fifth gating clock signal ICKBD and the eighth gating clock signal QCKBDB. The second discharge circuit 720 may change the voltage level of the second output node ON during a high-level period of the first gating clock signal ICKD and the fourth gating clock signal QCKBD, and may change the voltage level of the second output node ON during a high-level period of the fifth gating clock signal ICKBD and the eighth gating clock signal QCKBDB. When the first gating clock signal ICKD and the fourth gating clock signal QCKDB have a high level, or when the fifth gating clock signal ICKBD and the eighth gating clock signal QCKBDB have a high level, the second discharge circuit 720 may decrease the voltage level of the second output node ON by causing current to flow from the second output node ON to the terminal to which the second voltage V2 is supplied.

The comparator 730 may receive the first output signal OUTP and the second output signal OUTN. The comparator 730 may generate the duty detection signal DCD by comparing a voltage level of the first output signal OUTP with a voltage level of the second output signal OUTN. For example, when the voltage level of the first output signal OUTP is higher than the voltage level of the second output signal OUTN, the comparator 730 may generate the duty detection signal DCD having a high logic level. When the voltage level of the second output signal OUTN is higher than the voltage level of the first output signal OUTP, the comparator 730 may generate the duty detection signal DCD having a low logic level. The comparator 730 may further receive a comparison enable signal COMEN. The comparator 730 may be activated based on the comparison enable signal COMEN. When the comparison enable signal COMEN is enabled, the comparator 730 may be activated and may compare the first and second output signals OUTP, OUTN to output the duty detection signal DCD. When the comparison enable signal COMEN is disabled, the comparator 730 may be disabled and might not output the duty detection signal DCD.

The first discharge circuit 710 may include a first transistor T1, a second transistor T2, a third transistor T3, and a fourth transistor T4. The first to fourth transistors T1, T2, T3, T4 may be N-channel MOS transistors. A gate of the first transistor T1 may receive the second gating clock signal ICKDB, and a source of the first transistor T1 may be coupled with the terminal to which the second voltage V2 is supplied. A gate of the second transistor T2 may receive the seventh gating clock signal QCKBD, a drain of the second transistor T2 may be coupled with the first output node OP, and a source of the second transistor T2 may be coupled with the drain of the first transistor T1. A gate of the third transistor T3 may receive the third gating clock signal QCKD, and a drain of the third transistor T3 may be coupled with the first output node OP. A gate of the fourth transistor T4 may receive the sixth gating clock signal ICKBDB, a drain of the fourth transistor T4 is coupled with a source of the third transistor T3, and a source of the fourth transistor T4 may be coupled with the terminal to which the second voltage V2 is supplied.

The second discharge circuit 720 may include a fifth transistor T5, a sixth transistor T6, a seventh transistor T7, and an eighth transistor T8. The fifth to eighth transistors T5, T6, T7, T8 may be N-channel MOS transistors. A gate of the fifth transistor T5 may receive the first gating clock signal ICKD, and a drain of the fifth transistor T5 may be coupled with the second output node ON. A gate of the sixth transistor T6 may receive the fourth gating clock signal QCKDB, the drain of the sixth transistor T6 is coupled with a source of the fifth transistor T5, and a source of the sixth transistor T6 may be coupled with the terminal to which the second voltage V2 is supplied. A gate of the seventh transistor T7 may receive the fifth gating clock signal ICKBD, and a drain of the seventh transistor T7 may be coupled with the second output node ON. A gate of the eighth transistor T8 may receive the eighth gating clock signal QCKBDB, a drain of the eighth transistor T8 is coupled with a source of the seventh transistor T7, and a source of the eighth transistor T8 may be coupled with the terminal to which the second voltage V2 is supplied.

The duty detector 520 may further comprise a ninth transistor T9, a tenth transistor T10, an eleventh transistor T11, and a twelfth transistor T12. The ninth to twelfth transistors T9, T10, T11, T12 may function as a precharge circuit. The ninth and tenth transistors T9, T10 may apply the first voltage V1 to the first and second output nodes OP, ON, respectively, based on a precharge signal PCGB. The ninth and tenth transistors T9, T10 may receive the precharge signal PCGB and apply the first voltage V1 to the first and second output nodes OP, ON, respectively. The eleventh and twelfth transistors T11, T12 may selectively couple the first and second discharge circuits 710, 720 with the terminal to which the second voltage V2 is supplied based on the precharge signal PCGB. The eleventh and twelfth transistors T11, T12 may receive the precharge signal PCGB and may or might not couple the first and second discharge circuits 710, 720 with the terminal to which the second voltage V2 is supplied based on a logic level of the precharge signal PCGB. When the precharge signal PCGB is enabled to a low logic level, the ninth and tenth transistors T9, T10 may apply the first voltage V1 to the first and second output nodes OP, ON, and the eleventh and twelfth transistors T11, T12 might not couple the first and second discharge circuits 710, 720 with the terminal to which the second voltage V2 is supplied. When the first voltage V1 is applied to the first and second output nodes OP, ON, the first and second capacitors C1, C2 may be charged. When the precharge signal PCGB is disabled to a high logic level, the ninth and tenth transistors T9, T10 might not apply the first voltage V1 to the first and second output nodes OP, ON, and the eleventh and twelfth transistors T11, T12 may couple the first and second discharge circuits 710, 720 with the terminal to which the second voltage V2 is supplied.

The ninth and tenth transistors T9, T10 may be P-channel MOS transistors. A gate of the ninth transistor T9 may receive the precharge signal PCGB, a source of the ninth transistor T9 may be coupled with a terminal to which the first voltage V1 is supplied, and a drain of the ninth transistor T9 may be coupled with the first output node OP. The gate of the tenth transistor T10 may receive the precharge signal PCGB, a source of the tenth transistor T10 may be coupled with the terminal to which the first voltage V1 is supplied, and a drain of the tenth transistor T10 may be coupled with the second output node ON. The eleventh and twelfth transistors T11, T12 may be N-channel MOS transistors. A gate of the eleventh transistor T11 may receive the precharge signal PCGB, and a drain of the eleventh transistor T11 may be in common coupled with the sources of the first transistor T1 and the fourth transistor T4. A source of the eleventh transistor T11 may be coupled with the terminal to which the second voltage V2 is supplied. A gate of the twelfth transistor T12 may receive the precharge signal PCGB, and a drain of the twelfth transistor T12 may be in common coupled with the sources of the sixth transistor T6 and the seventh transistor T7. A source of the twelfth transistor T12 may be coupled with the terminal to which the second voltage V2 is supplied. The drain of the eleventh transistor T11 and the drain of the twelfth transistor T12 may be coupled. In an embodiment, the drain of the eleventh transistor T11 and the drain of the twelfth transistor T12 might not be coupled.

The duty detector 520 may further comprise a thirteenth transistor T13 and a fourteenth transistor T14. The thirteenth and fourteenth transistors T13, T14 may function as an enable circuit. The thirteenth and fourteenth transistors T13, T14 may selectively couple the first and second output nodes OP, ON with the first and second discharge circuits 710, 720, respectively, based on a strobe signal STB. The thirteenth transistor T13 may receive the strobe signal STB and selectively couple the first output node OP with the first discharge circuit 710 according to a logic level of the strobe signal STB. The fourteenth transistor T14 may receive the strobe signal STB, and may selectively couple the second output node ON and the second discharge circuit 720 according to a logic level of the strobe signal STB. When the strobe signal STB is enabled at a high logic level, the thirteenth transistor T13 may couple the first output node OP with the first discharge circuit 710, and the fourteenth transistor T14 may couple the second output node ON with the second discharge circuit 720. When the strobe signal STB is disabled to a low logic level, the thirteenth transistor T13 might not couple the first output node OP with the first discharge circuit 710, and the fourteenth transistor T14 might not couple the second output node ON with the second discharge circuit 720.

The thirteenth and fourteenth transistors T13, T14 may be N-channel MOS transistors. A gate of the thirteenth transistor T13 may receive the strobe signal STB, a drain of the thirteenth transistor T13 may be coupled to the first output node OP, and a source of the thirteenth transistor T13 may be in common coupled with the drains of the second and third transistors T2, T3. A gate of the fourteenth transistor T14 may receive the strobe signal STB, a drain of the fourteenth transistor T14 may be coupled with the second output node ON, and a source of the fourteenth transistor T14 may be in common coupled with the drains of the fifth and seventh transistors T5, T7.

Figure 8:
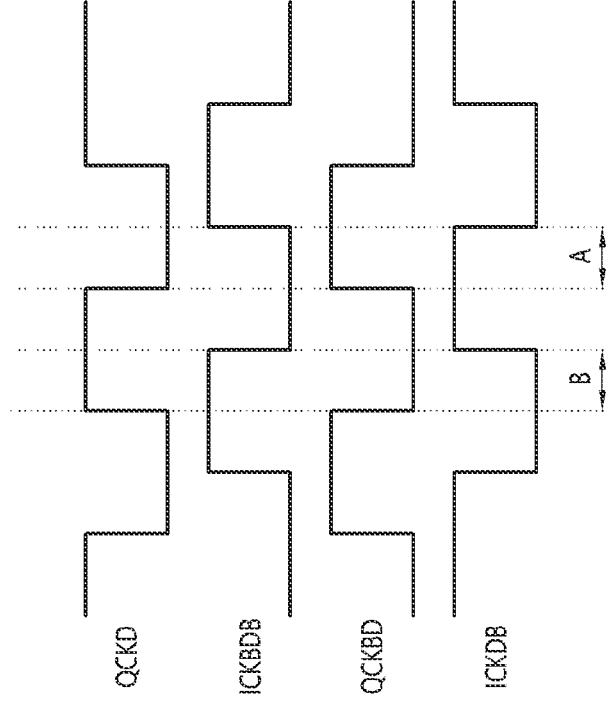
FIG. 8, FIG. 9A, and FIG. 9B are diagrams illustrating operations of a duty correction circuit according to various embodiments.
Figure 9A:
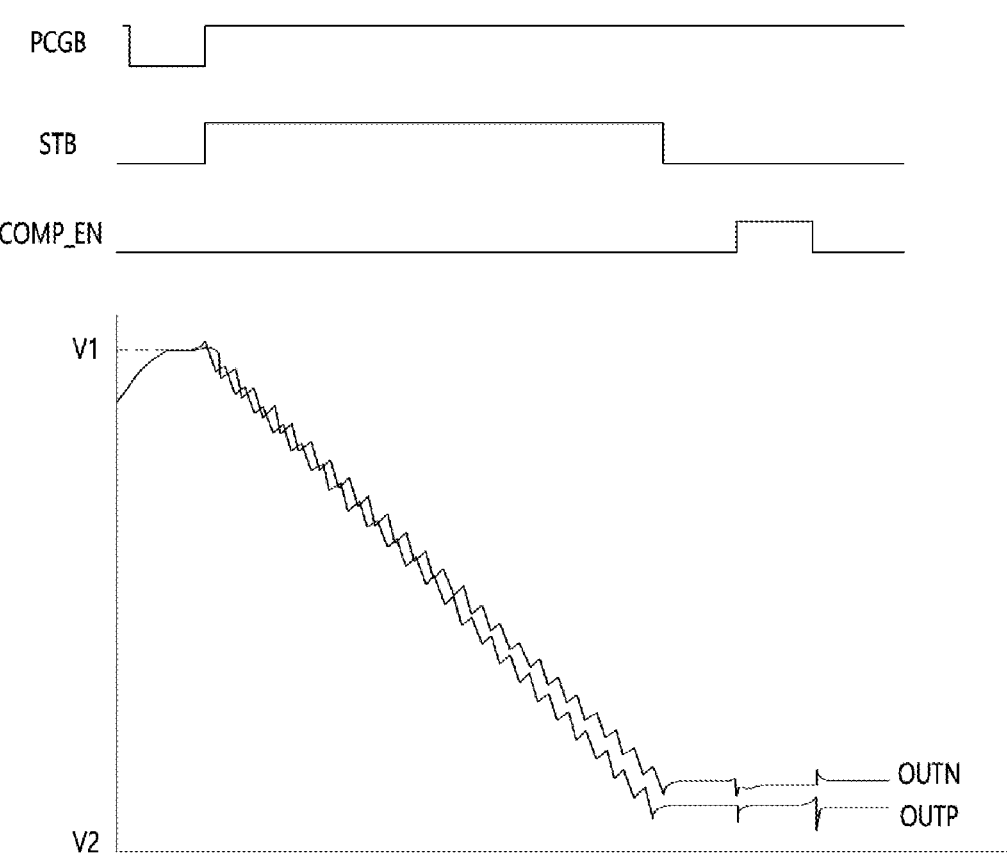
Figure 9B:
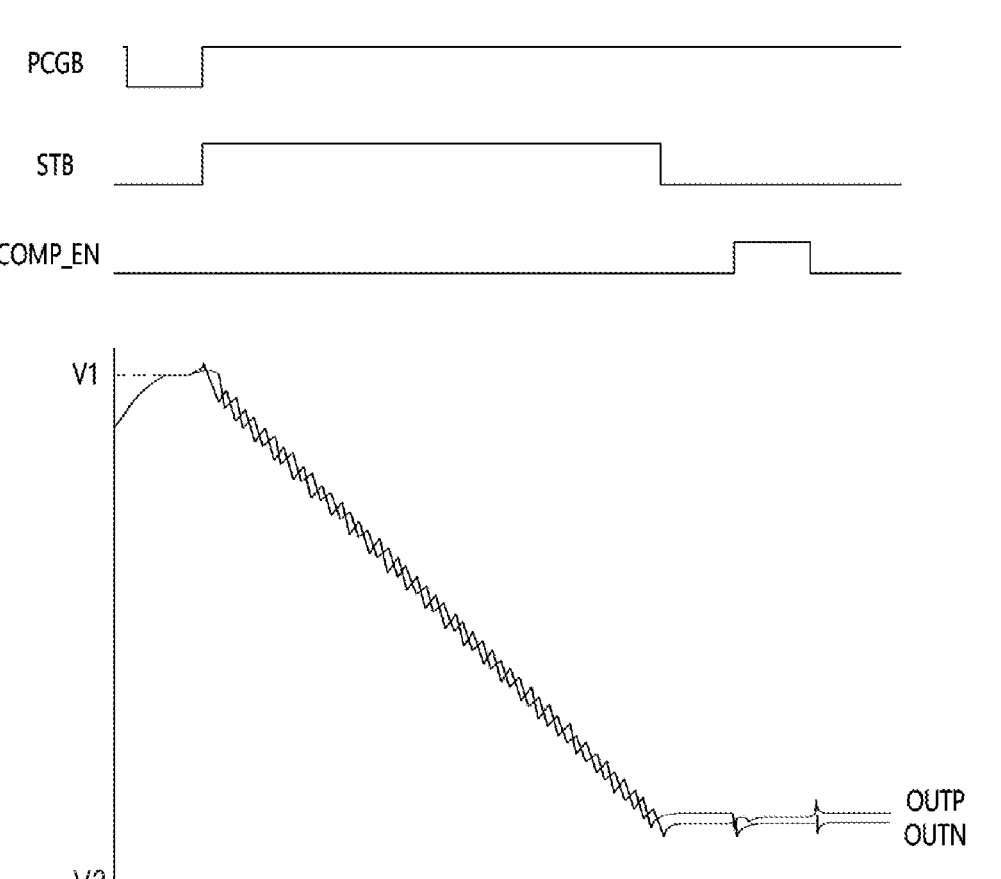

FIGS. 8, 9A, and 9B are diagrams illustrating an operation of the duty correction circuit 120 according to various embodiments. Referring to FIGS. 2 through 9B, an operation of the duty correction circuit 120 according to an embodiment will be described as follows. The first delay circuit 210 and the second delay circuit 220 may receive the delay-locked clock signal CKD output from the phase delay circuit 110 to generate the first delayed clock signal FCK and the second delayed clock signal VCK, respectively. The delay control signal DC<0:n> may be set to a default value, and a delay time of the second delay circuit 220 may substantially be the same as a delay time of the first delay circuit 210. However, phase skew may occur between the first delayed clock signal FCK and the second delayed clock signal VCK due to various factors such as process variations. The dividing circuit 230 may divide the first delayed clock signal FCK to generate the first and third phase clock signals ICK, ICKB, and may divide the second delayed clock signal VCK to generate the second and fourth phase clock signals QCK, QCKB. The duty detection circuit 410 may receive the first to fourth phase clock signals ICK, QCK, ICKB, QCKB to detect a phase skew between the first and second phase clock signals ICK, QCK or a phase skew between the third and fourth phase clock signals ICKB, QCKB.

The clock gating circuit 510 may gate the first phase clock signal ICK to generate the first and second gating clock signals ICKD, ICKDB, gate the second phase clock signal QCK to generate the third and fourth gating clock signals QCKD, QCKDB, gate the third phase clock signal ICKB to generate the fifth and sixth gating clock signals ICKBD, ICKBDB, and gate the fourth phase clock signal QCKB to generate the seventh and eighth gating clock signals QCKBD, QCKBDB. As illustrated in FIG. 8, the first discharge circuit 710 of the duty detector 520 may lower the voltage level of the first output node OP by discharging a current from the first output node OP to the terminal to which the second voltage V2 is supplied in A period where both the second gating clock signal ICKDB and the seventh gating clock signal QCKBD have a high level and in B period where both the third gating clock signal QCKD and the sixth gating clock signal ICKBDB have a high level. When the first discharge circuit 710 discharges the first output node OP, the charge that was charged in the first capacitor C1 may be discharged. The second discharge circuit 720 of the duty detector 520 may lower the voltage level of the second output node ON by discharging a current from the second output node ON to the terminal to which the second voltage V2 is supplied in C period where both the first gating clock signal ICKD and the fourth gating clock signal QCKDB have a high level and in D period where both the fifth gating clock signal ICKBD and the eighth gating clock signal QCKBDB have a high level. When the second discharge circuit 720 discharges the second output node ON, the charge that was charged in the second capacitor C2 may be discharged.

As shown in FIGS. 9A and 9B, when the precharge signal PCGB is enabled, the ninth and tenth transistors T9, T10 may be turned on, and the eleventh and twelfth transistors T11, T12 may be turned off. When the ninth and tenth transistors T9, T10 are turned on, the ninth and tenth transistors T9, T10 may apply the first voltage V1 to the first and second output nodes OP, ON, the first and second capacitors C1, C2 may be charged, and the first and second output nodes OP, ON may be precharged to a voltage level of the first voltage V1. When the precharge signal PCGB is disabled and the strobe signal STB is enabled, the ninth and tenth transistors T9, T10 may be turned off, and the eleventh to fourteenth transistors T11, T12, T13, T14 may be turned on. Thus, the first voltage V1 may no longer be applied to the first and second output nodes OP, ON, and a current path from the first output node OP to the terminal to which the second voltage V2 is supplied through the thirteenth transistor T13, the first discharge circuit 710, and the eleventh transistor T11 and a current path from the second output node ON to the terminal to which the second voltage V2 is supplied through the fourteenth transistor T14, the second discharge circuit 720, and the twelfth transistor T12 may be activated. The first discharge circuit 710 may decrease the voltage level of the first output node OP in the A period and the B period, and the second discharge circuit 720 may decrease the voltage level of the second output node ON in the C period and the D period. During a period in which the strobe signal STB is enabled, the voltage level of the first output node OP may gradually decrease as the charge that was charged on the first capacitor C1 is discharged whenever the A period and the B period occur. Similarly, during a period in which the strobe signal STB is enabled, the voltage level of the second output node ON may gradually decrease as the charge that was charged in the second capacitor C2 is discharged whenever the period C and the period D occur. When the strobe signal STB is disabled, current paths from the first output node OP and the second output node ON to the terminal to which the second voltage V2 is supplied may be disabled, and the voltage levels of the first and second output signals OUTP, OUTN may be determined according to the amount of charge remaining in the first and second capacitors C1, C2, respectively. At this time, the comparison enable signal COMEN may be enabled, and when the comparison enable signal COMEN is enabled, the comparator 730 may compare the voltage levels of the first and second output signals OUTP, OUTN to generate the duty detection signal DCD.

As shown in FIGS. 8 and 9A, when a phase difference between the first phase clock signal ICK and the second phase clock signal QCK, or a phase difference between the third phase clock signal ICKB and the fourth phase clock signal QCKB, becomes less than 90 degrees, the A period and the B period may be lengthened, while the C period and the D period may be shortened. Thus, the charge amount of the first capacitor C1 may be less than the charge amount of the second capacitor C2, and the voltage level of the second output signal OUTN may be higher than the voltage level of the first output signal OUTP. The comparator 730 may compare the voltage levels of the first and second output signals OUTP, OUTN to generate the duty detection signal DCD having a low logic level. The delay control signal generation circuit 420 may increase the logic value of the delay control signal DC<0:n> based on the duty detection signal DCD. When the logic value of the delay control signal DC<0:n> is increased, the delay time of the second delay circuit 220 may be increased, and the phase of the second delayed clock signal VCK may be delayed. When the phase of the second delayed clock signal VCK is delayed, the phase of the second and fourth phase clock signals QCK, QCKB may be delayed, and a phase difference between the first phase clock signal ICK and the second phase clock signal QCK or a phase difference between the third phase clock signal ICKB and the fourth phase clock signal QCKB may approach 90 degrees.

As shown in FIGS. 8 and 9B, when a phase difference between the first phase clock signal ICK and the second phase clock signal QCK or a phase difference between the third phase clock signal ICKB and the fourth phase clock signal QCKB is greater than 90 degrees, the A period and the B period may be shortened, while the C period and the D period may be lengthened. Therefore, the charge amount of the first capacitor C1 may be greater than the charge amount of the second capacitor C2, and the voltage level of the first output signal OUTP may be higher than the voltage level of the second output signal OUTN. The comparator 730 may compare the voltage levels of the first and second output signals OUTP, OUTN to generate the duty detection signal DCD having a high logic level. The delay control signal generation circuit 420 may decrease the logic value of the delay control signal DC<0:n> based on the duty detection signal DCD. When the logic value of the delay control signal DC<0:n> is reduced, the delay time of the second delay circuit 220 may be reduced, and the phase of the second delayed clock signal VCK may be advanced. When the phase of the second delayed clock signal VCK is advanced, the phase of the second and fourth phase clock signals QCK, QCKB may be advanced, and a phase difference between the first phase clock signal ICK and the second phase clock signal QCK or a phase difference between the third phase clock signal ICKB and the fourth phase clock signal QCKB may approach 90 degrees.

Figure 10:
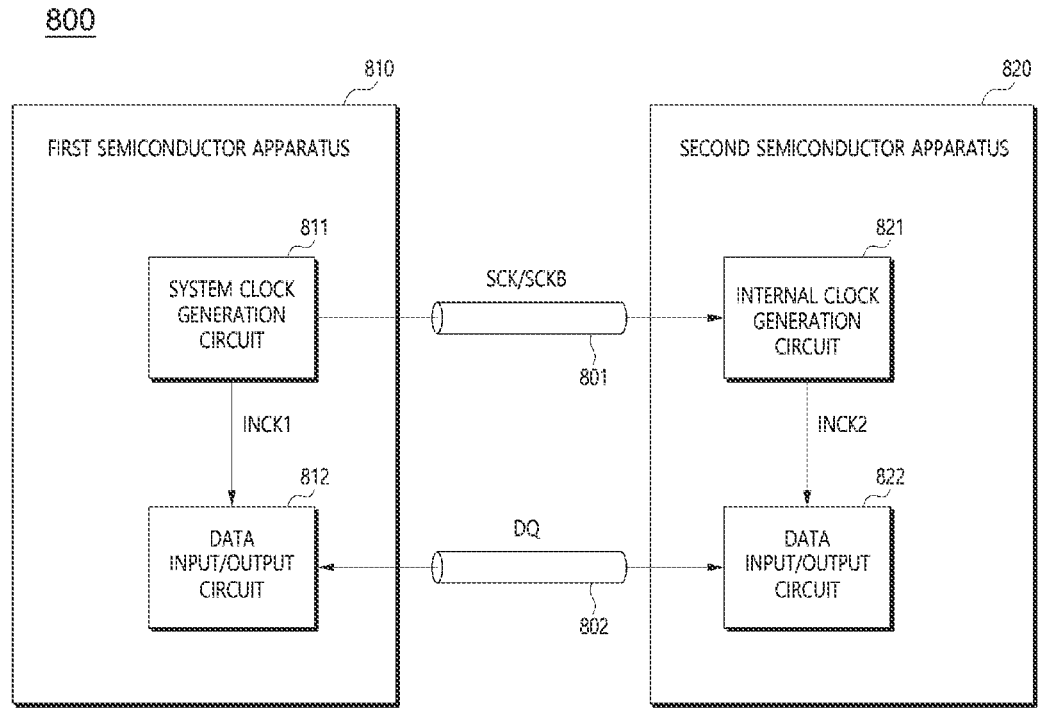
FIG. 10 is a diagram illustrating a configuration of a semiconductor system according to an embodiment.

FIG. 10 is a diagram illustrating a configuration of a semiconductor system 800 according to an embodiment. Referring to FIG. 10, the semiconductor system 800 may include a first semiconductor apparatus 810 and a second semiconductor apparatus 820. The first semiconductor apparatus 810 may be a master apparatus that provides various control signals required for the second semiconductor apparatus 820 to operate. The first semiconductor apparatus 810 may include various types of devices. For example, the first semiconductor apparatus 810 may be a host device such as a central processing unit (CPU), a graphic processing unit (GPU), a multi-media processor (MMP), a digital signal processor, an application processor (AP), and a memory controller, etc. The second semiconductor apparatus 820 may be a slave apparatus capable of performing various operations based on the control signals provided by the first semiconductor apparatus 810. The second semiconductor apparatus 820 may be, for example, a memory device, and the memory device may include volatile memory and non-volatile memory. The volatile memory may include SRAM (Static RAM), DRAM (Dynamic RAM), SDRAM (Synchronous DRAM), and the non-volatile memory may include ROM (Read Only Memory), PROM (Programmable ROM), EEPROM (Electrically Erasable and Programmable ROM), EPROM (Erasable Programmable ROM), flash memory, PRAM (Phase change RAM), MRAM (Magnetic RAM), RRAM (Resistive RAM), and FRAM (Ferroelectric RAM), etc.

The second semiconductor apparatus 820 may be coupled to the first semiconductor apparatus 810 through a plurality of buses. The plurality of buses may be signal transmission paths, links, or channels for transmitting signals. The plurality of buses may include a clock bus 801 and a data bus 802. The clock bus 801 may be a unidirectional bus from the first semiconductor apparatus 810 to the second semiconductor apparatus 820, and the data bus 802 may be a bidirectional bus. Although not shown, the semiconductor system 800 may further include a command bus and an address bus for transmitting command signals and address signals from the first semiconductor apparatus 810 to the second semiconductor apparatus 820. The second semiconductor apparatus 820 may be coupled to the first semiconductor apparatus 810 through the clock bus 801, and may receive a system clock signal SCK through the clock bus 801. The system clock signal SCK may be transmitted as a single-ended signal, or may be transmitted as a differential signal together with a complementary system clock signal SCKB. The second semiconductor apparatus 820 may be coupled to the first semiconductor apparatus 810 through the data bus 802, and may receive data DQ from the first semiconductor apparatus 810 and/or transmit data DQ to the first semiconductor apparatus 810 through the data bus 802.

The first semiconductor apparatus 810 may include a system clock generation circuit 811 and a data input/output circuit 812. The system clock generation circuit 811 may generate the system clock signal SCK. The system clock generation circuit 811 may provide the system clock signal SCK to the second semiconductor apparatus 820 through the clock bus 801. The system clock generation circuit 811 may transmit the complementary system clock signal SCKB along with the system clock signal SCK. The system clock generation circuit 811 may include a clock generation circuit such as an oscillator, a delay-locked loop circuit, a phase-locked loop circuit, or the like. The system clock generation circuit 811 may generate a plurality of first internal clock signals INCK1 having a constant phase difference sequentially from the system clock signal SCK. The clock generation circuit 100 shown in FIG. 1 may be applied as the system clock generation circuit 811.

The data input/output circuit 812 may receive the plurality of first internal clock signals INCK1 from the system clock generation circuit 811. The data input/output circuit 812 may be coupled with the data bus 802, and may transmit the data DQ to the second semiconductor apparatus 820 through the data bus 802 or receive data DQ transmitted from the second semiconductor apparatus 820 through the data bus 802. The data input/output circuit 812 may transmit the data DQ to the second semiconductor apparatus 820 in synchronization with the plurality of first internal clock signals INCK1, or may receive transmitted data DQ from the second semiconductor apparatus 820 in synchronization with the plurality of first internal clock signals INCK1.

The second semiconductor apparatus 820 may include an internal clock generation circuit 821 and a data input/output circuit 822. The internal clock generation circuit 821 may be coupled with the clock bus 801, and may receive the system clock signal SCK and the complementary system clock signal SCKB transmitted through the clock bus 801. The internal clock generation circuit 821 may include a delay-locked loop circuit that buffers the system clock signal SCK and the complementary system clock signal SCKB to generate a reference clock signal, and delays the reference clock signal to generate a delay-locked clock signal. The internal clock generation circuit 821 may generate a plurality of second internal clock signals INCK2 having a constant phase difference sequentially from the delay-locked clock signal. The internal clock generation circuit 821 may include a duty correction circuit to correct phase skews of the plurality of second internal clock signals INCK2. The clock generation circuit 100 illustrated in FIG. 1 may be applied as the internal clock generation circuit 821.

The data input/output circuit 822 may receive the plurality of second internal clock signals INCK2 from the internal clock generation circuit 821. The data input/output circuit 822 is coupled to the data bus 802, and may transmit data DQ to the first semiconductor apparatus 810 through the data bus 802 or receive data DQ transmitted from the first semiconductor apparatus 810 through the data bus 802. The data input/output circuit 822 may transmit the data DQ to the first semiconductor apparatus 810 in synchronization with the plurality of second internal clock signals INCK2, or may receive transmitted data DQ from the first semiconductor apparatus 810 in synchronization with the plurality of second internal clock signals INCK2.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:

1. A duty correction circuit comprising:
a first delay circuit configured to receive a clock signal and delay the clock signal to generate a first delayed clock signal;
a second delay circuit configured to receive the clock signal and variably delay the clock signal based on a delay control signal to generate a second delayed clock signal;
a dividing circuit configured to divide the first delayed clock signal to generate a first phase clock signal and a third phase clock signal, and configured to divide the second delayed clock signal to generate a second phase clock signal and a fourth phase clock signal;
a duty detection circuit configured to gate the first to fourth phase clock signals to generate a plurality of gating clock signals, and configured to generate a duty detection signal based on the plurality of gating clock signals; and
a delay control signal generation circuit configured to generate the delay control signal based on the duty detection signal.

2. The duty correction circuit of claim 1,
wherein the first phase clock signal is synchronized to odd rising edges of the first delayed clock signal, and the third phase clock signal is synchronized to even rising edges of the first delayed clock signal, and
wherein the second phase clock signal is synchronized to odd falling edges of the second delayed clock signal, and the fourth phase clock signal is synchronized to even falling edges of the second delayed clock signal.

3. The duty correction circuit of claim 1, wherein the dividing circuit comprises:
a first divider configured to divide the first delayed clock signal to generate the first phase clock signal and the third phase clock signal; and
a second divider configured to divide the second delayed clock signal to generate the second phase clock signal and the fourth phase clock signal.

4. The duty correction circuit of claim 3, wherein the first divider comprises:
a first inverter configured to invert the first phase clock signal;
a second inverter configured to invert an output signal of the first inverter;
a first flip-flop configured to output the output signal of the first inverter as the first phase clock signal in synchronization with the first delayed clock signal; and a second flip-flop configured to output an output signal of the second inverter as the third phase clock signal in synchronization with the first delayed clock signal.

5. The duty correction circuit of claim 3, wherein the second divider comprises:
a first inverter configured to invert the second delayed clock signal;
a second inverter configured to invert the second phase clock signal;
a third inverter configured to invert an output signal of the second inverter;
a first flip-flop configured to output the output signal of the second inverter as the second phase clock signal in synchronization with an output signal of the first inverter; and
a second flip-flop configured to output an output signal of the third inverter as the fourth phase clock signal in synchronization with the output signal of the first inverter.

6. The duty correction circuit of claim 1, wherein the duty detection circuit comprises:
a clock gating circuit configured to gate the first phase clock signal to generate a first gating clock signal and a second gating clock signal, configured to gate the second phase clock signal to generate a third gating clock signal and a fourth gating clock signal, configured to gate the third phase clock signal to generate a fifth gating clock signal and a sixth gating clock signal, and configured to gate the fourth phase clock signal to generate a seventh gating clock signal and an eighth gating clock signal; and
a duty detector configured to generate a first output signal and a second output signal based on the first to eighth gating clock signals, and configured to compare the first output signal and the second output signal to generate the duty detection signal.

7. The duty correction circuit of claim 6, wherein the duty detector is configured to change a voltage level of the first output signal based on the second gating clock signal, the third gating clock signal, the sixth gating clock signal, and the seventh gating clock signal, and configured to change a voltage level of the second output signal based on the first gating clock signal, the fourth gating clock signal, the fifth gating clock signal, and the eighth gating clock signal.

8. The duty correction circuit of claim 6, wherein the duty detector comprises:
a first output node to which a first voltage is applied;
a second output node to which the first voltage is applied;
a first capacitor coupled between the first output node and a terminal to which a second voltage is supplied, and the first output signal being output from the first output node;
a second capacitor coupled between the second output node and the terminal to which the second voltage is supplied, and the second output signal being output from the second output node;
a first discharge circuit configured to discharge the first output node when the second gating clock signal and the seventh gating clock signal have a high logic level and when the third gating clock signal and the sixth gating clock signal have a high logic level;
a second discharge circuit configured to discharge the second output node when the first gating clock signal and the fourth gating clock signal have a high logic level and when the fifth gating clock signal and the eighth gating clock signal have a high logic level; and a comparator configured to compare voltage levels of the first and second output signals to generate the duty detection signal.

9. A clock generation circuit comprising:

a phase delay circuit configured to receive a reference clock signal and delay the reference clock signal to generate a delay-locked clock signal;

a first delay circuit configured to receive the delay-locked clock signal and delay the delay-locked clock signal to generate a first delayed clock signal;

a second delay circuit configured to receive the delay-locked clock signal and variably delay the delay-locked clock signal to generate a second delayed clock signal based on a delay control signal;

a dividing circuit configured to divide the first delayed clock signal to generate a first phase clock signal and a third phase clock signal, and configured to divide the second delayed clock signal to generate a second phase clock signal and a fourth phase clock signal;

a clock gating circuit configured to gate the first to fourth phase clock signals to generate a first gating clock signal, a second gating clock signal, a third gating clock signal, a fourth gating clock signal, a fifth gating clock signal, a sixth gating clock signal, a seventh gating clock signal, and an eighth gating clock signal;

a duty detector configured to generate a first output signal and a second output signal based on the first to eighth gating clock signals, and configured to compare the first and second output signals to generate a duty detection signal; and a delay control signal generation circuit configured to generate the delay control signal based on the duty detection signal.

10. The clock generation circuit of claim 9, wherein the first phase clock signal is synchronized to odd rising edges of the first delayed clock signal, and the third phase clock signal is synchronized to even rising edges of the first delayed clock signal, and wherein the second phase clock signal is synchronized to odd falling edges of the second delayed clock signal, and the fourth phase clock signal is synchronized to even falling edges of the second delayed clock signal.

11. The clock generation circuit of claim 9, wherein the dividing circuit comprises:

a first divider configured to divide the first delayed clock signal to generate the first phase clock signal and the third phase clock signal; and a second divider configured to divide the second delayed clock signal to generate the second phase clock signal and the fourth phase clock signal.

12. The clock generation circuit of claim 11, wherein the first divider comprises:

a first inverter configured to invert the first phase clock signal;

a second inverter configured to invert an output signal of the first inverter;

a first flip-flop configured to output the output signal of the first inverter as the first phase clock signal in synchronization with the first delayed clock signal; and a second flip-flop configured to output an output signal of the second inverter as the third phase clock signal in synchronization with the first delayed clock signal.

13. The clock generation circuit of claim 11, wherein the second divider comprises:

a first inverter configured to invert the second delayed clock signal;

a second inverter configured to invert the second phase clock signal;

a third inverter configured to invert an output signal of the second inverter;

a first flip-flop configured to output the output signal of the second inverter as the second phase clock signal in synchronization with an output signal of the first inverter; and a second flip-flop configured to output an output signal of the third inverter as the fourth phase clock signal in synchronization with the output signal of the first inverter.

14. The clock generation circuit of claim 9, wherein the clock gating circuit is configured to gate the first phase clock signal to generate the first gating clock signal and the second gating clock signal, configured to gate the second phase clock signal to generate the third gating clock signal and the fourth gating clock signal, configured to gate the third phase clock signal to generate the fifth gating clock signal and the sixth gating clock signal, and configured to gate the fourth phase clock signal to generate the seventh gating clock signal and the eighth gating clock signal.

15. The clock generation circuit of claim 9, wherein the duty detector is configured to change a voltage level of the first output signal based on the second gating clock signal, the third gating clock signal, the sixth gating clock signal, and the seventh gating clock signal, and configured to change a voltage level of the second output signal based on the first gating clock signal, the fourth gating clock signal, the fifth gating clock signal, and the eighth gating clock signal.

16. The clock generation circuit of claim 9, wherein the duty detector comprises:

a first output node to which a first voltage is applied;

a second output node to which the first voltage is applied;

a first capacitor coupled between the first output node and a terminal to which a second voltage is supplied, and the first output signal being output from the first output node;

a second capacitor coupled between the second output node and the terminal to which the second voltage is supplied, and the second output signal being output from the second output node;

a first discharge circuit configured to discharge the first output node when the second gating clock signal and the seventh gating clock signal have a high logic level and when the third gating clock signal and the sixth gating clock signal are at a high logic level;

a second discharge circuit configured to discharge the second output node when the first gating clock signal and the fourth gating clock signal have a high logic level and when the fifth gating clock signal and the eighth gating clock signal are at a high logic level; and a comparator configured to compare voltage levels of the first and second output signals to generate the duty detection signal.

* * * * *